United States Patent
Sung et al.

(10) Patent No.: US 11,227,873 B2
(45) Date of Patent: Jan. 18, 2022

(54) DISPLAY DEVICE WITH PASSIVATION LAYER THAT DIRECTLY CONTACTS THE SUBSTRATE AND MANUFACTURING METHOD THEREOF

(71) Applicant: SAMSUNG DISPLAY CO., LTD., Yongin-si (KR)

(72) Inventors: Woo Yong Sung, Seoul (KR); Doo Hwan Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/171,526

(22) Filed: Oct. 26, 2018

(65) Prior Publication Data

US 2019/0280017 A1 Sep. 12, 2019

(30) Foreign Application Priority Data

Mar. 6, 2018 (KR) ........................ 10-2018-0026478

(51) Int. Cl.
| | | |
|---|---|---|
| H01L 27/32 | (2006.01) |
| H01L 27/12 | (2006.01) |
| H01L 23/29 | (2006.01) |
| H01L 23/31 | (2006.01) |
| H01L 21/02 | (2006.01) |
| H01L 51/00 | (2006.01) |
| H01L 51/52 | (2006.01) |

(52) U.S. Cl.
CPC .... *H01L 27/1218* (2013.01); *H01L 21/02118* (2013.01); *H01L 21/02288* (2013.01); *H01L 21/02348* (2013.01); *H01L 23/291* (2013.01); *H01L 23/293* (2013.01); *H01L 23/3178* (2013.01); *H01L 23/3192* (2013.01); *H01L 27/1266* (2013.01); *H01L 51/0097* (2013.01); *H01L 51/5237* (2013.01); H01L 27/3244 (2013.01); H01L 51/52 (2013.01); H01L 2227/326 (2013.01); H01L 2251/5338 (2013.01); H01L 2251/558 (2013.01)

(58) Field of Classification Search
CPC ... H01L 27/3251–3253; H01L 27/1262; H01L 51/00–56
See application file for complete search history.

(56) References Cited

U.S. PATENT DOCUMENTS

2016/0174304 A1 6/2016 Kim et al.
2017/0097543 A1* 4/2017 Kang ................ G02F 1/133528
(Continued)

FOREIGN PATENT DOCUMENTS

| KR | 10-2017-0093835 | 8/2017 |
| KR | 10-1787941 | 10/2017 |
| WO | 2016/093476 | 6/2016 |

OTHER PUBLICATIONS

Taro et al., KR 10-2014-0060151, published May 19, 2014.*
Google Patents translation of KR 10-2014-0060151.*

*Primary Examiner* — Suberr L Chi
(74) *Attorney, Agent, or Firm* — F. Chau & Associates, LLC

(57) ABSTRACT

A display device includes: a substrate; a transistor disposed on a first surface of the substrate; and a passivation layer disposed on a second surface of the substrate opposite from the first surface, wherein the passivation layer directly contacts the substrate, and the passivation layer includes a UV curable resin.

16 Claims, 19 Drawing Sheets

(56) References Cited

U.S. PATENT DOCUMENTS

| | | |
|---|---|---|
| 2017/0152412 A1 | 6/2017 | Suzuki et al. |
| 2017/0158918 A1 | 6/2017 | Jozuka et al. |
| 2017/0217143 A1 | 8/2017 | Kim et al. |
| 2017/0260425 A1 | 9/2017 | Yamamoto et al. |

\* cited by examiner

DISPLAY DEVICE WITH PASSIVATION LAYER THAT DIRECTLY CONTACTS THE SUBSTRATE AND MANUFACTURING METHOD THEREOF

CROSS-REFERENCE TO RELATED APPLICATION

This application claims priority under 35 U.S.C. § 119 from, and the benefit of, Korean Patent Application No. 10-2018-0026478, filed in the Korean Intellectual Property Office on Mar. 6, 2018, the contents of which are herein incorporated by reference in their entirety.

BACKGROUND

(a) Technical Field

Embodiments of the present disclosure are directed to a display device and a manufacturing method thereof, and more particularly, to a display device in which a lower passivation film is replaced with a UV curable resin, and a manufacturing method thereof.

(b) Discussion of the Related Art

With the development of information technology, sales of display devices, which is a medium that connects users and information, have been increasing. Accordingly, display devices such as liquid crystal displays (LCDs), organic light emitting diode displays (OLEDs), electrophoretic displays (EPDs), or plasma display panels (PDPs), have been increasingly used.

In recent years, a flexible display device has been developed which has reduced weight and thickness to improve portability and that can be bent or folded. A flexible display device can be implemented using a flexible substrate such as a plastic substrate instead of a glass substrate.

SUMMARY

Exemplary embodiments can provide a display device and a manufacturing method thereof, which omit an adhesive layer and simplify a manufacturing process by directly positioning a passivation layer that includes a UV curable resin on a substrate.

An exemplary embodiment of the present disclosure provides a display device, including: a substrate; a transistor disposed on a first surface of the substrate; and a passivation layer disposed on a second surface of the substrate opposite form the first surface, wherein the passivation layer directly contacts the substrate, and the passivation layer includes a UV curable resin.

An edge of the passivation layer may be curved.

The first surface of the substrate may include a microgroove, and the microgroove may be filled with the passivation layer.

The passivation layer may include a carbide.

The UV curable resin may include at least one of a polyester acrylate, an epoxy acrylate, an urethane acrylate, a polyether acrylate, a silicone acrylate, an alicyclic epoxy resin, a glycidyl ether epoxy resin, an epoxy acrylate, or a vinyl ether. The passivation layer further may include at least one of a polyfunctional monomer, a monofunctional monomer, an epoxy-based monomer, a vinyl ether, or a cyclic ether.

The passivation layer may further include a photopolymerization initiator that includes at least one of a benzoin ether, an amine, a diazonium salt, an iodonium salt, a sulfonium salt, or a metallocene compound.

The passivation layer may be a multi-layered passivation layer.

Each layer of the multi-layered passivation layer may have a different material.

Each layer of the multi-layered passivation layer may have a same material.

The substrate may include a display area and a non-display area, and a thickness of the passivation layer disposed in the display area may be greater than a thickness of the passivation layer disposed in the non-display area.

The passivation layer disposed in the display area may have a multi-layered structure, and the passivation layer disposed in the non-display area may have a single-layered structure.

The substrate may be flexible and may include a bendable area disposed between the display area and the non-display area, and no passivation layer may be disposed in the bendable area. A side surface of the passivation layer may be curved at a boundary between the display area and the bendable area and a boundary between the non-display area and the bendable area.

The passivation layer may include a main display area and auxiliary display areas disposed adjacent to four sides of the main display area, the main display area and the auxiliary display areas may be separated from each other, and no passivation layer is positioned at portions where the main display area and the auxiliary display areas are separated from each other.

An exemplary embodiment of the present disclosure provides a method of manufacturing a display device, including: preparing a substrate that has a first surface on which a transistor is formed; forming a resin layer that includes a UV curable resin on a second surface of the substrate opposite from the first surface by an inkjet process; and forming a passivation layer by curing the resin layer with UV irradiation.

The UV curable resin may include at least one of a polyester acrylate, an epoxy acrylate, an urethane acrylate, a polyether acrylate, a silicone acrylate, an alicyclic epoxy resin, a glycidyl ether epoxy resin, an epoxy acrylate, or a vinyl ether.

The substrate may include a bendable area positioned between a display area and a non-display area, and no passivation layer is formed in the bendable area.

The second surface of the substrate may include a microgroove, and the microgroove may be filled with the resin layer when forming the resin layer.

Preparing the substrate may include separating the substrate from a carrier substrate, and the passivation layer may include a carbide formed when separating the substrate from the carrier substrate.

An exemplary embodiment of the present disclosure provides a display device, including: a substrate that includes a display area and a non-display area; and a passivation layer that includes a UV curable resin disposed on a first surface of the substrate. The passivation layer directly contacts the substrate, the first surface of the substrate includes a microgroove that is filled with the passivation layer, and a thickness of the passivation layer disposed in the display area is greater than a thickness of the passivation layer disposed in the non-display area.

The display device may further include a transistor disposed on a second surface of the substrate opposite from the first surface.

According to the exemplary embodiments, it is possible to omit an adhesive layer and simplify a manufacturing process by directly positioning a passivation layer that includes a UV curable resin on a substrate.

DETAILED DESCRIPTION OF EXEMPLARY EMBODIMENTS

Figure 1:
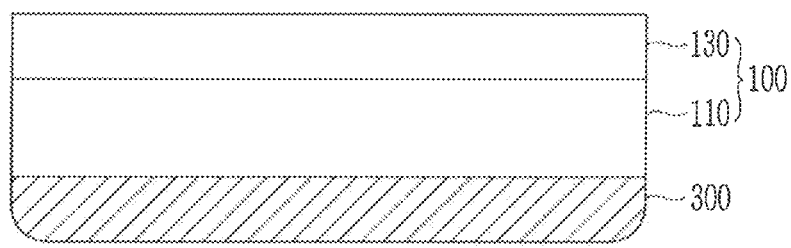
FIG. 1 schematically illustrates a display device according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Like numerals may refer to like or similar constituent elements throughout the specification.

Further, sizes and thicknesses of constituent members shown in the accompanying drawings may be arbitrarily given for better understanding and ease of description. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Hereinafter, a display device according to an exemplary embodiment of the present disclosure will be described with reference to the accompanying drawings.

FIG. 1 schematically illustrates a display device according to an exemplary embodiment of the present disclosure. Referring to FIG. 1, a display device according to the exemplary embodiment of the present disclosure includes a substrate 110, a transistor 130 disposed on a first surface of the substrate 110, and a passivation layer 300 disposed on a second surface of the substrate 110 opposite from the first surface.

According to an exemplary embodiment, the substrate 110 is flexible. For example, the substrate 110 may include a polyimide. Although FIG. 1 illustrates only the transistor 130 on the substrate 110, this display device would include a first electrode connected with the transistor 130, a second electrode disposed to face the first electrode, and a liquid crystal layer or an emission layer disposed between the first electrode and the second electrode. A detailed structure thereof will be described below. According to an embodiment, a structure that includes the substrate 110 and the transistor 130 is referred to as a display panel 100.

According to an exemplary embodiment, the passivation layer 300 is disposed on the second surface of the substrate 110. The passivation layer 300 includes a UV curable resin, and directly contacts the substrate 110. In other words, an additional adhesive layer or adhesive is not disposed between the passivation layer 300 and the substrate 110. Since the passivation layer 300 includes a UV curable resin, it can adhere to the substrate 110 without using an adhesive layer or an adhesive.

According to an exemplary embodiment, the UV curable resin include at least one of a polyester acrylate, an epoxy acrylate, an urethane acrylate, a polyether acrylate, a silicone acrylate, an alicyclic epoxy resin, a glycidyl ether epoxy resin, an epoxy acrylate, or a vinyl ether. However, embodiments of the present disclosure are not limited thereto. Any material that can be cured by UV irradiation is available without limitation.

In addition, the passivation layer 300 may further include a monomer, a photopolymerization initiator, an additive, etc., in addition to the UV curable resin. The monomer can include at least one of a polyfunctional monomer, a monofunctional monomer, an epoxy-based monomer, a vinyl ether, or a cyclic ether. The photopolymerization initiator can include at least one of a benzoin ether, a amine, a diazonium salt, an iodonium salt, a sulfonium salt, or a metallocene compound. The additive can be an adhesion imparting agent, a filler, a polymerization inhibitor, or the like, and may be, for example, a silane coupling agent.

According to an exemplary embodiment, a thickness of the display panel 100 is be in a range of from about 25 μm to about 35 μm. In addition, a thickness of the passivation layer 300 is in a range of from about 80 μm to about 120 μm.

Referring to FIG. 1, according to an exemplary embodiment, an edge of the passivation layer 300 may have a curved portion. For example, a boundary between an upper surface and a side surface of the passivation layer 300 has a smoothly curved surface instead of being angled. This is because the passivation layer 300 is formed by applying a UV curable resin with an inkjet process and performing UV irradiation, as the resin flows in this process. That is, an edge of the passivation layer 300 has a smooth curve instead of being right-angled due to the flow of the resin and the polymerization during the coating and curing process.

Figure 2:
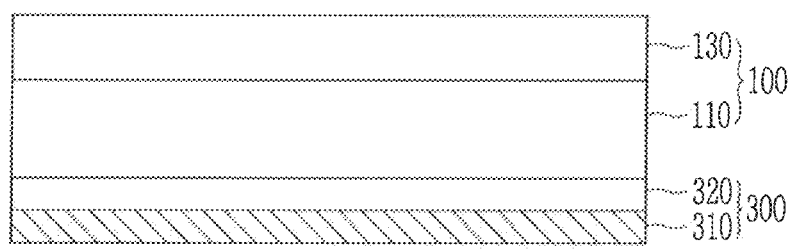
FIG. 2 illustrates a display device according to a comparative embodiment of the present disclosure.

According to an exemplary embodiment, FIG. 2 illustrates a display device according to a comparative embodiment of the present disclosure. Referring to FIG. 2, in a comparative embodiment, a display device includes an adhesive layer 320 disposed between the display panel 100 and a passivation film 310. In this case, a sum of thicknesses of the passivation film 310 and the adhesive layer 320 is in a range of from about 80 μm to about 120 μm. When the passivation film 310 is attached to the display panel 100, an additional process of forming the adhesive layer 320 is required. However, according to a present exemplary embodiment, a process of forming the adhesive layer 320 can be omitted by directly forming the passivation layer 300 that includes the UV curable resin on the substrate 110.

As described above, according to an exemplary embodiment, since the passivation layer 300 is directly disposed on the substrate 110, surface defects of the substrate 110 are filled by the passivation layer 300. When the substrate 110 is a flexible substrate that includes a polyimide, etc., a carrier glass is attached to the substrate 110 to maintain a shape of the flexible substrate in a transistor-forming process. Thereafter, all structures of the display panel 100, such as the transistor 130, are formed, and then the carrier glass is removed from the substrate 110. The removal is performed using a laser, and a portion of the substrate 110 is carbonized by laser irradiation, which can generate a carbide. In addition, irregularities can be formed on the surface of the substrate 110 while removing the carrier glass from the substrate 110.

Figure 3:
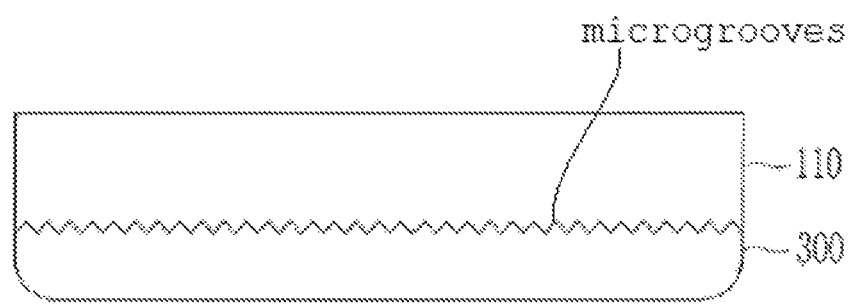
FIG. 3 schematically illustrates a substrate with irregularities and a passivation layer.

FIG. 3 schematically illustrates a substrate with irregularities and a passivation layer. In FIG. 3, irregularities and grooves are exaggerated and shown larger for better comprehension and ease of description, but they may not be visually recognizable by an unaided eye. However, when checking through a scanning electron microscope, etc., the irregularities and grooves are visible on the surface.

Referring to FIG. 3, in a present exemplary embodiment, since the passivation layer 300 is directly formed in contact with the substrate 110, the irregularities and defects of the substrate 110 are filled by the passivation layer 300. The passivation layer 300 is formed by applying a UV curable resin in an inkjet process and then curing the resin by irradiating UV. Accordingly, in the inkjet process, the UV curable resin penetrates the irregularities and the grooves of the substrate 110 and is then cured, thereby healing the defects of the surface of the substrate 110. This differs from the comparative embodiment in which a passivation film is attached to the substrate 110. When the passivation layer is attached in the form of a film, it can be challenging to heal the defects of the surface of the substrate 110.

Figure 4:
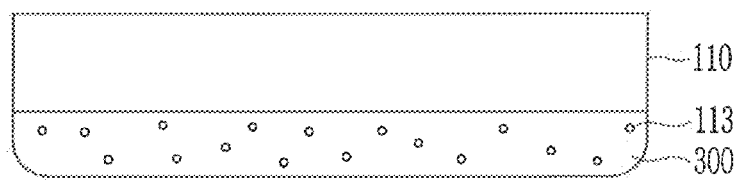
FIG. 4 schematically illustrates a passivation layer that includes a carbide.

In addition, according to an exemplary embodiment, since the passivation layer 300 is disposed directly on the substrate 110, any carbide remaining on the substrate 110 is included in the passivation layer 300. FIG. 4 schematically illustrates a passivation layer that includes a carbide 113. As described above, a portion of the substrate 110 is carbonized that generates the carbide 113 during a process of removing the carrier glass from the substrate 110 by laser irradiation. Thereafter, the carbide 113 is contained in the passivation layer 300 while applying the UV curable resin to the substrate 110 in the inkjet process. However, in a comparative embodiment in which the passivation film 310 is attached to the substrate 110, an adhesive layer 320 is disposed between the passivation film 310 and the substrate 110, and thus the carbide 113 is not included in the passivation film 310.

Hereinafter, the passivation layer 300 according to various exemplary embodiments of the present disclosure will be described.

FIG. 5 to FIG. 11 illustrate a passivation layer according to various embodiments of the present disclosure.

Figure 5:
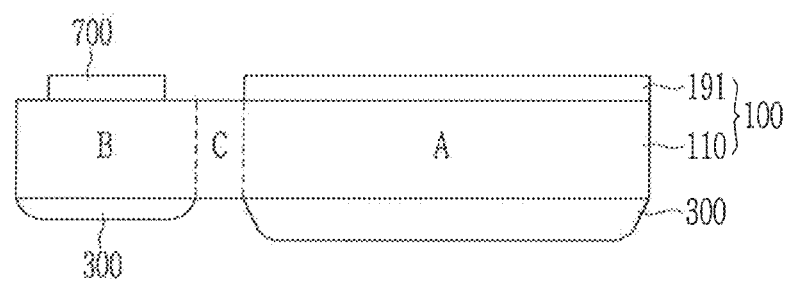
FIG. 5 to FIG. 11 illustrate a passivation layer according to various embodiments of the present disclosure.

Referring to FIG. 5, according to an exemplary embodiment, the display panel 100 includes a display area A that includes a first electrode 191 and a non-display area B in which a pad 700, etc., is disposed, and a thickness of the passivation layer 300 disposed in the display area A is thicker than that of the passivation layer 300 disposed in the non-display area B.

According to an exemplary embodiment, when the thickness of the passivation layer 300 is not sufficient, a transistor, etc., can be damaged during the UV irradiation process that cures the passivation layer 300. Accordingly, the display area A has a passivation layer 300 with a thickness that is greater than or equal to a predetermined thickness, but the non-display area B does not need a thick passivation layer 300. As a result, the thicknesses of the passivation layer 300 disposed in the display area A and the non-display area B differ from each other. This can be accomplished by adjusting the thicknesses of the applied UV curable resin during the inkjet process.

Figure 6:
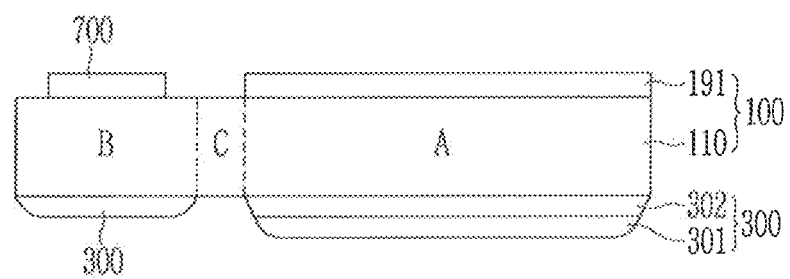

In addition, according to an exemplary embodiment, as illustrated in FIG. 6, the passivation layer 300 of the display area A may have multiple layers 301 and 302, while the passivation layer 300 of the non-display area B has a single layer.

Referring to FIG. 5, according to an exemplary embodiment, the display panel 100 further includes a bendable area C disposed between the display area A and the non-display area B, and no passivation layer is disposed in the bendable area C. Accordingly, it is possible to minimize stress generated when the display panel 100 is bent. When a passivation layer is disposed in the bendable area C, a stress caused by compression or tension occurs when the display device is bent. However, in the case of the display device according to a present exemplary embodiment, since no passivation layer is disposed in the bendable area, the display device can be appropriately bent.

According to an exemplary embodiment, when the passivation layer is formed using a passivation film, a cutting process is added to remove the passivation film from the bendable area C. However, when the passivation layer is formed using a UV curable resin, the passivation layer 300 as shown in FIG. 5 is formed through an inkjet process. That is, ink is applied in a desired shape in an inkjet process, with no separate cutting process. As a result, the manufacturing process can be simplified.

Referring to FIG. 5, according to an exemplary embodiment, an edge of the passivation layer 300 is curved at a boundary between the display area A and the bendable area C and at a boundary between non-display area B and the bendable area C. That is, an edge of the passivation layer 300 has a gentle rounded curve instead of a sharp angle. This is because the passivation layer 300 is formed by applying resin in the inkjet process and then curing it, as opposed to cutting the passivation layer 300, According to an exemplary embodiment, the edge of the passivation layer 300 has a gentle side surface formed in the curing process.

Figure 7:
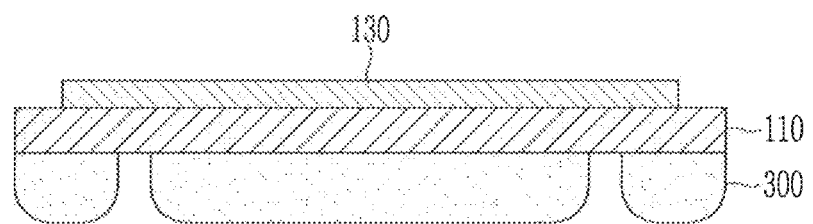

FIG. 7 to FIG. 10 illustrate a display device according to various exemplary embodiments. Referring to FIG. 7, according to an exemplary embodiment, the passivation layer 300 is formed of a single layer. In FIG. 7 to FIG. 10, grooves in the passivation layer 300 are illustrated as an example, and the grooves can be positioned in any portion of the substrate 110. Alternately, no grooves are formed in the passivation layer 300.

Figure 8:
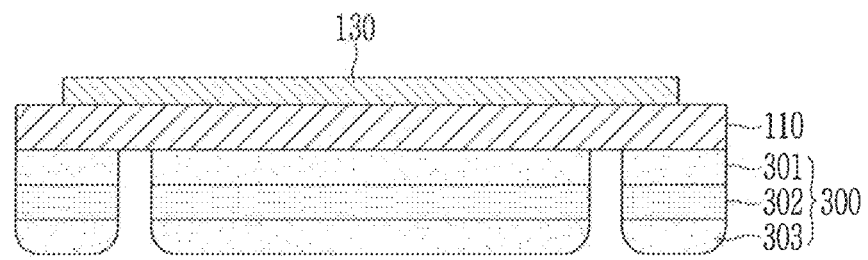

Referring to FIG. 8, according to an exemplary embodiment, the passivation layer 300 is formed of multiple layers that include a first layer 301, a second layer 302, and a third layer 303. In this case, the respective layers may include a same material or may include different materials. Although the passivation layer 300 is illustrated as including three layers, the passivation layer 300 may include two, four or more layers.

Figure 9:
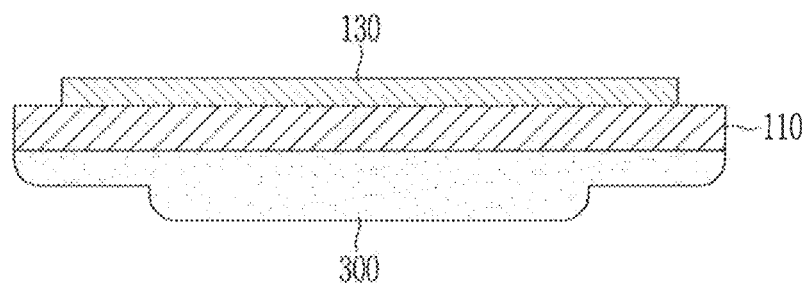
Figure 10:
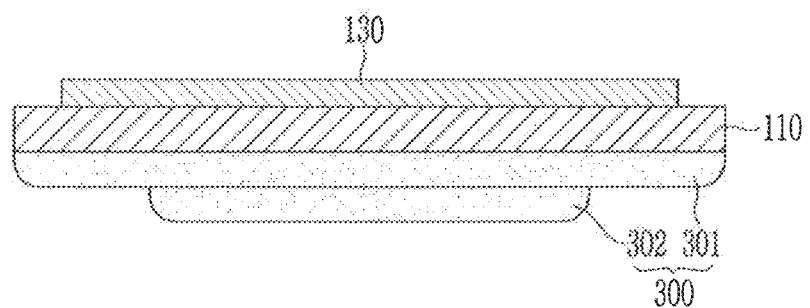

In addition, referring to FIG. 9, according to an exemplary embodiment, the passivation layer 300 has different thicknesses per region. For example, the passivation layer 300 is thicker in a center portion of the substrate 110 and thinner in edge portions of the substrate 110. Referring to FIG. 10, according to an exemplary embodiment, the passivation layer 300 has different thicknesses per region. A thick region in a center portion of the substrate 110 has a multi-layered structure with first and second layers 301 and 302, and a thin region in edge portions of the substrate 110 has a single-layer structure formed of the first layer 301.

Figure 11:
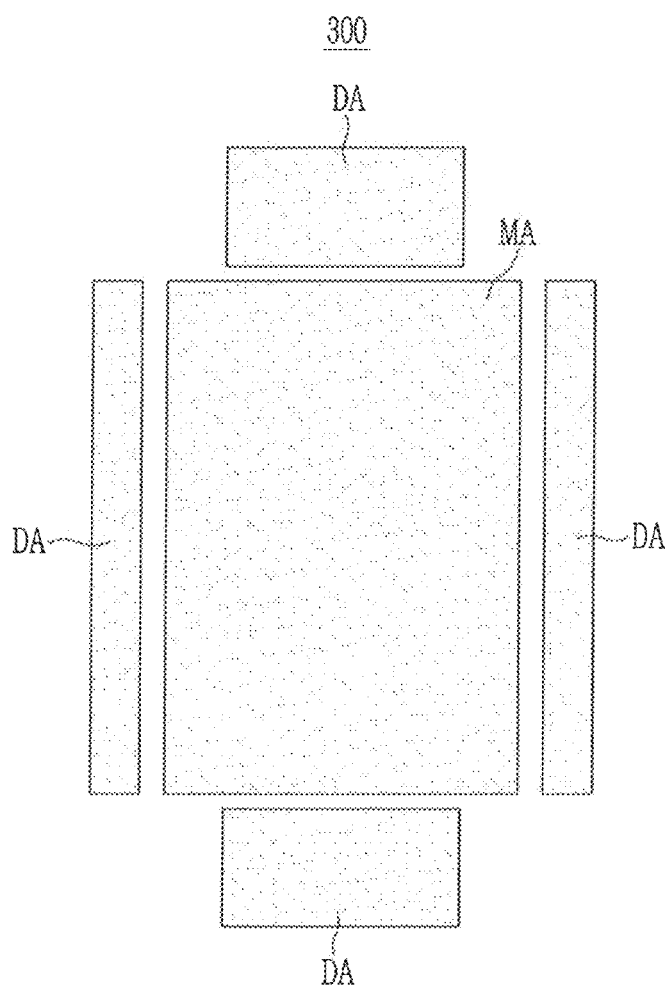

FIG. 11 illustrates the passivation layer 300 according to an exemplary embodiment of the present disclosure. Referring to FIG. 11, the passivation layer 300 includes a main display area MA and auxiliary display areas DA disposed adjacent to four sides of the main display area MA in a plan view. The main display area MA and the auxiliary display areas DA are separated from each other, and no passivation layer 300 is disposed at portions where the auxiliary display areas DA are separated from main display area MA.

Specifically, according to an exemplary embodiment, FIG. 11 illustrates a structure of the passivation layer 300 for a display device in which all four sides are bent, and the passivation layer 300 has a shape that corresponds to all of the main display area MA and the auxiliary display areas DA disposed at the four sides of the main display area MA. However, no passivation layer 300 is disposed at the bendable portions where the main display area MA and the auxiliary display areas DA are separated from each other.

Therefore, according to an exemplary embodiment, a display device in which four sides are bent can be realized. When a passivation layer is processed using a passivation film, the process complicated and expensive. However, as in a present exemplary embodiment, when the passivation layer 300 is formed with a UV curable resin, it can be easily formed by an inkjet process.

Hereinafter, a method of manufacturing a display device according to an exemplary embodiment of the present disclosure will be described. A manufacturing method according to a present exemplary embodiment includes preparing a substrate that has a first surface on which a transistor is disposed, forming a resin layer that includes a UV curable resin on a second surface of the substrate by an inkjet process, and forming a passivation layer by curing the resin layer by UV irradiation.

FIG. 12A to FIG. 12G illustrate a manufacturing process of a display device according to an exemplary embodiment of the present disclosure. A manufacturing method will now be described with reference to FIG. 12A to FIG. 12G. Cross-sectional views and top plan views of a display device are simultaneously presented in FIG. 12A to FIG. 12G.

Figure 12A:
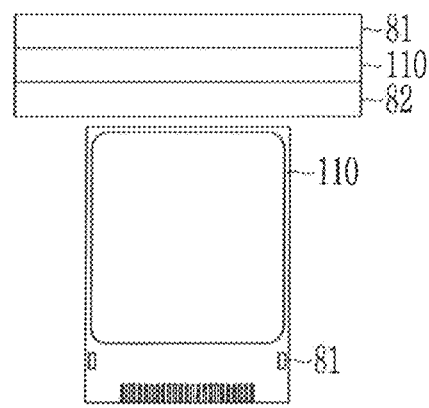
FIG. 12A to FIG. 12G illustrate a manufacturing process of a display device according to an exemplary embodiment of the present disclosure.

Referring to FIG. 12A, according to an exemplary embodiment, a substrate 110 is prepared that has a first surface on which a transistor is formed. The substrate 110 is flexible, and includes an electrode connected with the transistor, and a light-emitting element layer or a liquid crystal layer. Preparing the substrate includes attaching a carrier glass to the substrate 110 to maintain a shape of the flexible substrate in a transistor-forming process. Thereafter, all structures of the display device, such as the transistors, are formed, and then the carrier glass is removed from the substrate 110. The removal is performed using a laser, and a portion of the substrate 110 is carbonized by laser irradiation, which generates carbides. In addition, irregularities can be formed on the surface of the substrate 110 while removing the carrier glass.

Referring to FIG. 12A, according to an exemplary embodiment, an upper passivation film 81 is formed on the first surface of the substrate 110, and a temporary passivation film 82 is formed on a second surface thereof.

Figure 12B:
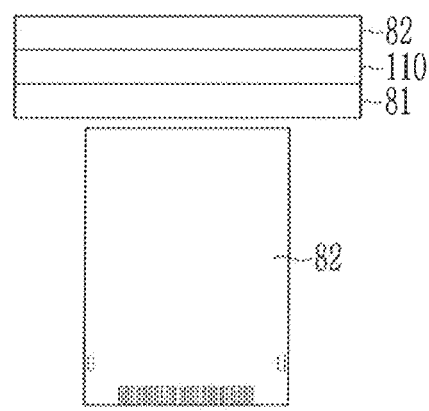

Next, referring to FIG. 12B, according to an exemplary embodiment, the display device is turned over so that the temporary passivation film 82 faces upward.

Figure 12C:
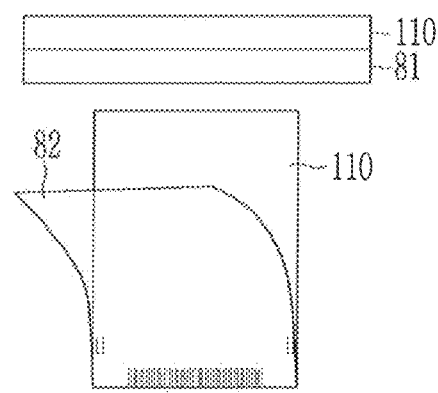

Next, referring to FIG. 12C, according to an exemplary embodiment, the temporary passivation film 82 is removed to expose a rear surface of the substrate 110.

Figure 12D:
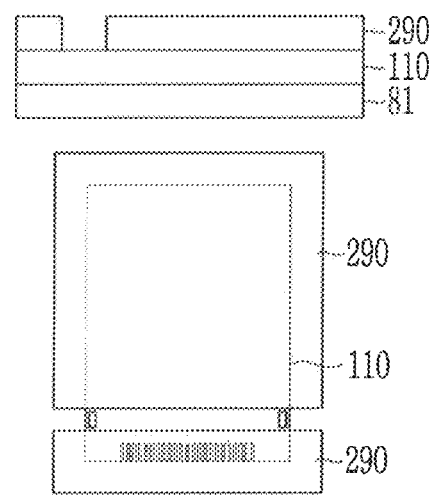

Next, referring to FIG. 12D, according to an exemplary embodiment, a resin layer 290 that includes a UV curable resin is formed on the substrate 110 by an inkjet process. In this case, no UV curable resin is coated on the bendable regions.

Figure 12E:
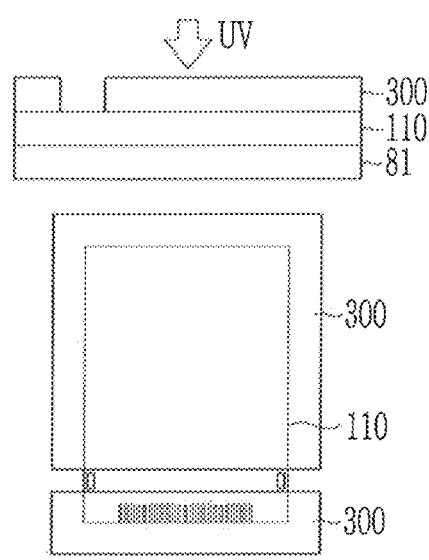

Next, according to an exemplary embodiment, referring to FIG. 12E, the passivation layer 300 is formed by curing the resin layer 290 by UV irradiation. This UV irradiation process attaches the passivation layer 300 to the substrate 110 without using an adhesive or an adhesive layer.

Figure 12F:
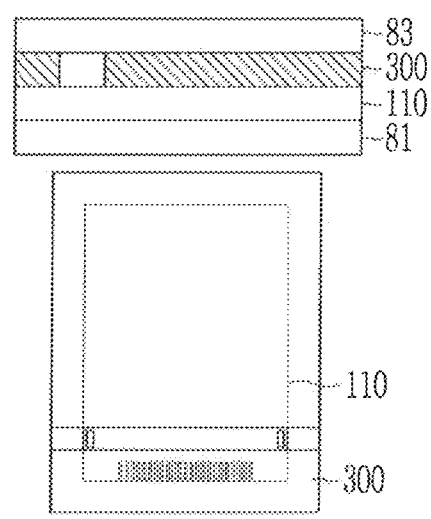

Next, referring to FIG. 12F, according to an exemplary embodiment, a carrier film 83 is attached to the passivation layer 300.

Figure 12G:
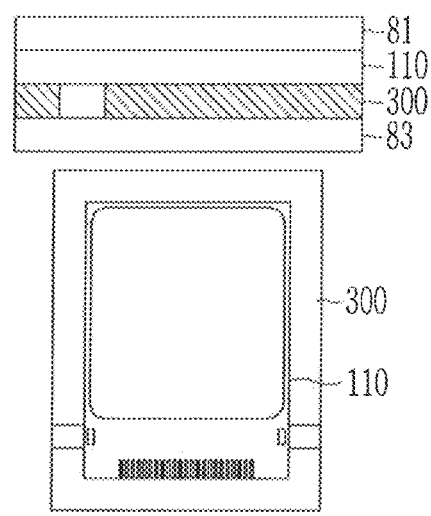

Next, referring to FIG. 12G, according to an exemplary embodiment, the display device is turned over again so that the carrier film 83 faces downward.

According to an exemplary embodiment, when the passivation layer is formed using a UV curable resin instead of a passivation film, no additional adhesive layer are needed such that an adhesive layer forming process can be omitted. In addition, the passivation film uses an additional cutting process, but a passivation layer can be coated in a desired shape in the forming step using the inkjet process. Accordingly, the manufacturing process can be simplified.

According to embodiments, a passivation layer can be formed while filling irregularities and microgrooves of the substrate, thereby healing the defects of the substrate. In addition, a passivation layer can include carbides remaining on the substrate due to the manufacturing process, and the passivation layer includes curved surfaces on the respective four sides.

Hereinafter, a structure of the display panel 100 according to an exemplary embodiment of the present disclosure will be described. This is a detailed description of the display panel 100, which is represented by the substrate 110 and the transistor 130 positioned on the substrate 110. However, this is merely an example, and embodiments of the structure of the display panel 100 are not limited thereto.

Figure 13:
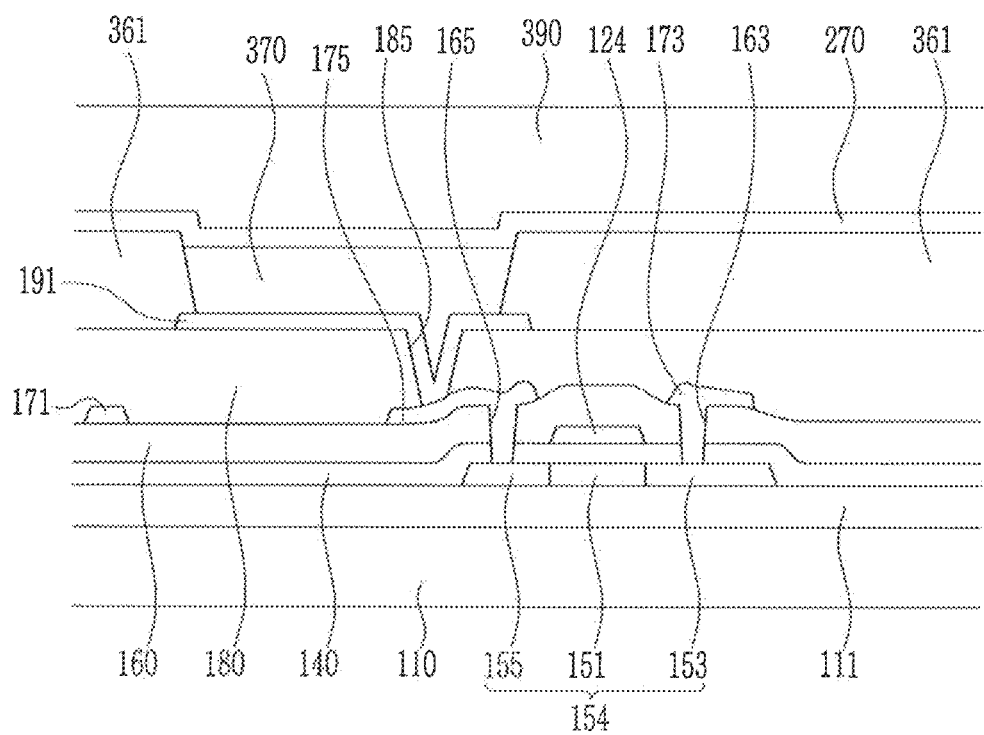
FIG. 13 is a cross-sectional view of a display device according to an exemplary embodiment of the present disclosure.

FIG. 13 is a cross-sectional view of a display device according to an exemplary embodiment of the present disclosure. Referring to FIG. 13, a buffer layer 111 formed of, e.g., a silicon oxide or a silicon nitride, is disposed on the first substrate 110.

According to an exemplary embodiment, a semiconductor layer 154 is disposed on the buffer layer 111. The semiconductor layer 154 includes a source region 153 and a drain region 155 doped with a p-type impurity and a channel region 151 between the source region 153 and the drain region 155.

According to an exemplary embodiment, a gate insulating layer 140 is disposed on the semiconductor layer 154 and the buffer layer 111 and includes silicon oxide or silicon nitride. A gate electrode 124 is disposed on the gate insulating layer 140 that overlaps the channel region 151 of the semiconductor layer 154.

According to an exemplary embodiment, an interlayer insulating layer 160 is disposed on the gate electrode 124 and the gate insulating layer 140. The interlayer insulating layer 160 has a first contact hole 165 and a second contact hole 163.

According to an exemplary embodiment, a data conductor that includes a data line 171, a source electrode 173, and a drain electrode 175 is disposed on the interlayer insulating layer 160.

According to an exemplary embodiment, the drain electrode 175 is connected with the drain region 155 through the first contact hole 165. In addition, the source electrode 173 is connected with the source region 153 through the second contact hole 163.

According to an exemplary embodiment, a passivation layer 180 is positioned on the data conductor 171, 173, and 175 and the interlayer insulating layer 160, and has a contact hole 185.

According to an exemplary embodiment, the first electrode 191 is disposed on the passivation layer 180. The first electrode 191 serves as a pixel electrode. The first electrode 191 is connected to the drain electrode 175 through the contact hole 185. A partition wall 361 is disposed on the passivation layer 180. A light-emitting element layer 370 is disposed on and overlaps the first electrode 191, and a second electrode 270 is disposed on and overlaps the light-emitting element layer 370. The second electrode 270 serves as a common electrode.

In this case, according to an exemplary embodiment, the first electrode 191 serves as an anode which is a hole injection electrode, and the second electrode 270 serves as a cathode which is an electron injection electrode. However, embodiments are not limited thereto, and the first electrode 191 can serve as a cathode and the second electrode 270 can serve as an anode, depending on the method of driving a display device.

According to an exemplary embodiment, the light-emitting element layer 370 includes an emission layer, an electron transport layer, a hole transport layer, etc.

According to an exemplary embodiment, an encapsulation layer 390 is disposed on and overlaps the second electrode 270. The encapsulation layer 390 may include an organic material or an inorganic material, or may include an organic material and an inorganic material that are alternately stacked. The encapsulation layer 390 protects the display device against moisture, heat, and other external contaminations.

While embodiments of this disclosure has been described in connection with what is presently considered to be practical exemplary embodiments, it is to be understood that embodiments of the disclosure are not limited to exemplary embodiments, but, on the contrary, are intended to cover various modifications and equivalent arrangements included within the spirit and scope of the appended claims.

What is claimed is:

1. A display device comprising:
a substrate that includes a display area and a non-display area;
a transistor disposed on a first surface of the substrate; and
a passivation layer disposed on a second surface of the substrate opposite from the first surface,
wherein the passivation layer directly contacts, and is formed below the substrate, and a thickness of the passivation layer disposed in the display area is greater than a thickness of the passivation layer disposed in the non-display area, and the passivation layer includes a UV curable resin.

2. The display device of claim 1, wherein an edge of the passivation layer is curved.

3. The display device of claim 1, wherein
the second surface of the substrate includes a microgroove, and
the microgroove is filled with the passivation layer.

4. The display device of claim 1, wherein the passivation layer includes a carbide.

5. The display device of claim 1, wherein
the UV curable resin includes at least one of a polyester acrylate, an epoxy acrylate, an urethane acrylate, a polyether acrylate, a silicone acrylate, are alicyclic epoxy resin, a glycidyl ether epoxy resin, an epoxy acrylate, or a vinyl ether, and
the passivation layer further includes at least one of a polyfunctional monomer, a monofunctional monomer, an epoxy-based monomer, a vinyl ether, or a cyclic ether.

6. The display device of claim 5, wherein the passivation layer further includes a photopolymerization initiator that includes at least one of a benzoin ether, an amine, a diazonium salt, an iodonium salt, a sulfonium salt, or a metallocene compound.

7. The display device of claim 1, wherein the passivation layer is a multi-layered passivation layer.

8. The display device of claim 7, wherein each layer of the multi-layered passivation layer has a different material.

9. The display device of claim 7, wherein each layer of the multi-layered passivation layer has a same material.

10. The display device of claim 1, wherein
the substrate includes a display area and a non-display area, and
a thickness of the passivation layer disposed in the display area is greater than a thickness of the passivation layer disposed in the non-display area.

11. The display device of claim 10, wherein
the passivation layer disposed in the display area has a multi layered structure, and
the passivation layer disposed in the non-display area has a single-layered structure.

12. The display device of claim 10, wherein
the substrate is flexible and includes a bendable area positioned between the display area and the non-display area,
no passivation layer is disposed in the bendable area, and
a side surface of the passivation layer is curved at a boundary between the display area and the bendable area and a boundary between the non-display area and the bendable area.

13. The display device of claim 1, wherein
the passivation layer includes a main display area and auxiliary display areas disposed adjacent to four sides of the main display area,
the main display area and the auxiliary display areas are separated from each other, and
no passivation layer is disposed at portions where the main display, area and the auxiliary display areas are separated from each other.

14. A display device comprising:
a substrate that includes a display area and a non-display area; and
a passivation layer that includes a UV curable resin disposed on a first surface of the substrate, wherein
the passivation layer directly contacts, and is formed below the substrate,
the first surface of the substrate includes a microgroove that is filled with the passivation layer, and
a thickness of the passivation layer disposed in the display area is greater than a thickness of the passivation layer disposed in the non-display area.

15. The display device of claim 14, further comprising a transistor disposed on a second surface of the substrate opposite from the first surface.

16. A display device comprising:
a substrate that includes a display area and a non-display area;
a transistor disposed on a first surface of the substrate; and a passivation layer disposed on a second surface of the substrate opposite from the first surface, wherein the passivation layer directly contacts, and is formed below the substrate, and a thickness of the passivation layer disposed in the display area overlapped with a first electrode in a vertical direction, is greater than a thickness of the passivation layer disposed in the non-display area overlapped with a pad, and the passivation layer includes a UV curable resin.

* * * * *